United States Patent
Sandoh

(10) Patent No.: US 10,083,867 B2
(45) Date of Patent: Sep. 25, 2018

(54) METHOD OF PROCESSING A WAFER

(71) Applicant: DISCO CORPORATION, Tokyo (JP)

(72) Inventor: Hideyuki Sandoh, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/679,407

(22) Filed: Aug. 17, 2017

(65) Prior Publication Data

US 2018/0068895 A1   Mar. 8, 2018

(30) Foreign Application Priority Data

Sep. 5, 2016   (JP) ................................. 2016-172887

(51) Int. Cl.
    *H01L 21/78*   (2006.01)
    *H01L 21/3065*   (2006.01)

(52) U.S. Cl.
    CPC .......... *H01L 21/78* (2013.01); *H01L 21/3065* (2013.01)

(58) Field of Classification Search
    CPC .......................... H01L 21/78; H01L 21/3065
    See application file for complete search history.

(56) References Cited

U.S. PATENT DOCUMENTS

| | | | |
|---|---|---|---|
| 2009/0014718 A1* | 1/2009 | Hong | ...................... H01L 22/14 257/48 |
| 2014/0242756 A1* | 8/2014 | Xue | ....................... H01L 21/78 438/113 |
| 2016/0141209 A1* | 5/2016 | Takano | ............... H01L 21/3046 257/620 |

FOREIGN PATENT DOCUMENTS

JP   2001-127011   5/2001

* cited by examiner

*Primary Examiner* — Errol Fernandes
(74) *Attorney, Agent, or Firm* — Greer Burns & Crain Ltd.

(57) ABSTRACT

A method of processing a wafer having a metal film formed on a reverse side thereof includes removing a metal film on the reverse side of the wafer along an outer circumferential edge of the wafer, thereby exposing a substrate of the wafer along the outer circumferential edge thereof, detecting a projected dicing line on a face side of the wafer with an infrared camera through the substrate exposed along the outer circumferential edge of the wafer and performing alignment of the wafer based on the detected projected dicing line, removing the metal film on the reverse side of the wafer along the detected projected dicing line, and thereafter, forming dividing grooves in the substrate along the projected dicing lines by plasma etching, thereby dividing the wafer into individual device chips.

3 Claims, 16 Drawing Sheets

METHOD OF PROCESSING A WAFER

BACKGROUND OF THE INVENTION

Field of the Invention

The present invention relates to a method of processing a wafer using a plasma dicing machine.

Description of the Related Art

As a method of dividing a wafer with a plurality of semiconductor devices such as integrated circuits (ICs), large-scale integration (LSI) circuits, etc. formed on its surface into individual device chips, there has been known a method of cutting a wafer along projected dicing lines thereon with a cutting blade. According to such a processing method, the transverse intensity of the wafer is reduced due to chipping on the face and reverse sides of the device chips.

One chipping-free processing method that has been developed is a processing method referred to as plasma dicing that divides a wafer into individual device chips by plasma etching (see, for example, Japanese Patent No. 4387007).

SUMMARY OF THE INVENTION

The processing method disclosed in Japanese Patent No. 4387007 is disadvantageous in that it requires new steps to be carried out and more raw materials to be added, leading to a cost increase because it is necessary to coat a wafer with a resist film that protects devices on device chips, thereby forming a mask.

Furthermore, if a wafer is coated on its reverse side with a metal film that functions as a heat radiator and electrodes, then the metal film proves obstructive to dicing by plasma etching as it cannot be removed by plasma etching.

It is an object of the present invention to provide a wafer processing method that is capable of dividing a wafer coated on its reverse side with a metal film into device chips without causing an increase in the cost.

In accordance with an aspect of the present invention, there is provided a method of processing a wafer having a plurality of devices formed on a face side thereof that are demarcated by a plurality of projected dicing lines that cross each other and a metal film formed on a reverse side thereof, including a protective member applying step of applying a protective member to the face side of the wafer, an outer circumferential metal film removing step of holding a protective member side of the wafer on a chuck table and removing the metal film on the reverse side of the wafer along an outer circumferential edge of the wafer, thereby exposing a substrate of the wafer along the outer circumferential edge thereof, an alignment step of detecting a projected dicing line on the face side of the wafer with an infrared camera through the substrate exposed along the outer circumferential edge of the wafer, and performing alignment of the wafer based on the detected projected dicing line, a metal film removing step of removing the metal film on the reverse side of the wafer along the detected projected dicing line, and, thereafter, a dividing step of forming dividing grooves in the substrate along the projected dicing lines by plasma etching, thereby dividing the wafer into individual device chips.

Preferably, the dividing step includes performing plasma etching on the substrate using an unremoved portion of the metal film as a mask. Preferably, the method further includes a functional layer removing step of, before the protective member applying step, removing a functional layer deposited on the face side of the wafer, from the wafer along the projected dicing lines.

Preferably, the method further includes a passivation film removing step of, before the dividing step, removing a passivation film formed on a functional layer deposited on the face side of the wafer, from the wafer along the projected dicing lines, in which the dividing step includes performing plasma etching on the substrate using an unremoved portion of the passivation film as a mask.

The above and other objects, features and advantages of the present invention and the manner of realizing them will become more apparent, and the invention itself will best be understood from a study of the following description and appended claims with reference to the attached drawings depicting some preferred embodiments of the invention.

DETAILED DESCRIPTION OF THE PREFERRED EMBODIMENTS

Methods of processing a wafer according to preferred embodiments of the present invention will be described in detail below with reference to the accompanying drawings. The present invention is not limited to the details of the preferred embodiments described below. The components, steps, and other details described below should be interpreted as covering those which can easily be conjured up by those skilled in the art and those which are essentially identical or equivalent thereto. Furthermore, it is possible for features described below to be combined in appropriate ways. Various omissions, replacements, and modifications may be made in the embodiments without departing from the scope of the present invention.

Figure 1:
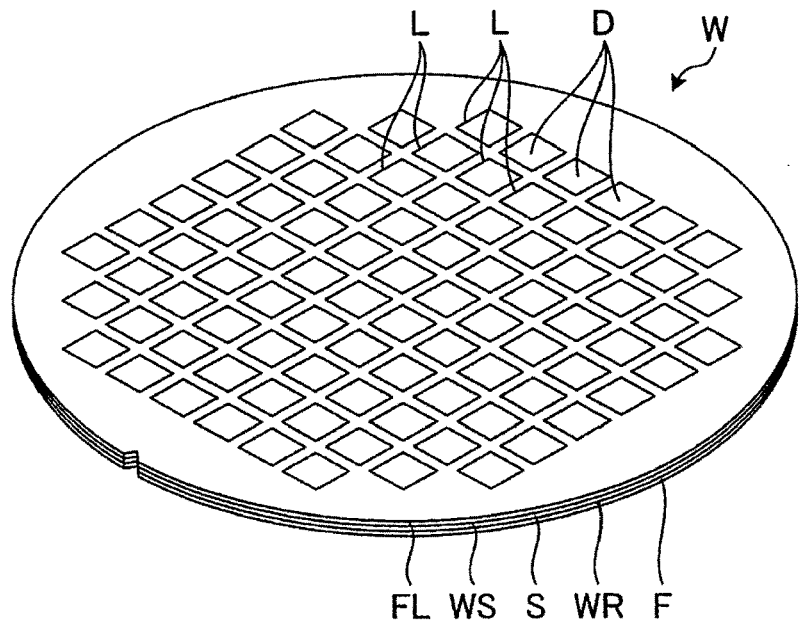
FIG. 1 is a perspective view of a wafer to be processed by a wafer processing method according to a first embodiment of the present invention.
Figure 2:
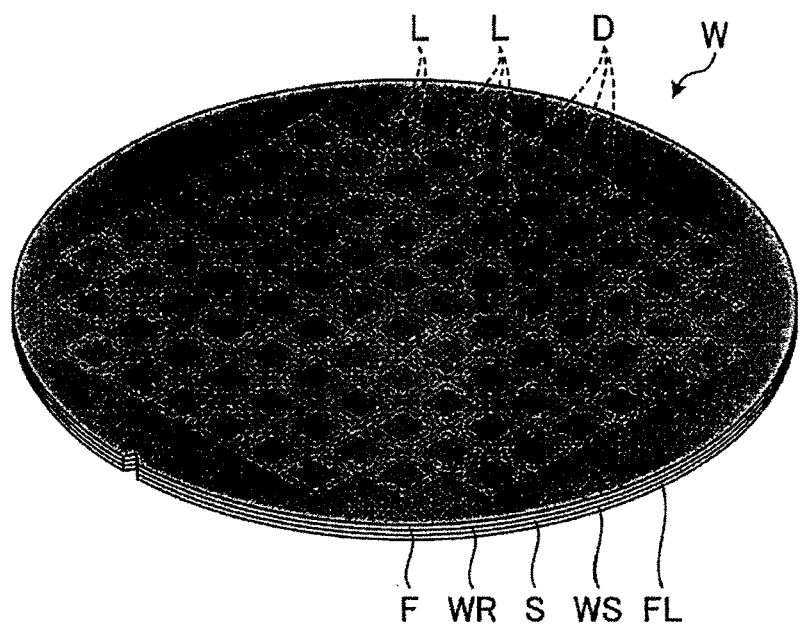
FIG. 2 is a perspective view of the wafer depicted in FIG. 1, depicting a reverse side thereof.

A method of processing a wafer (also referred to as "wafer processing method") according to a first embodiment of the present invention will first be described below with reference to FIGS. 1 through 18. The wafer processing method according to the first embodiment is a method of processing a wafer W depicted in FIGS. 1 and 2. According to the first embodiment, the wafer W depicted in FIGS. 1 and 2 refers to a disk-shaped semiconductor wafer or optical device wafer having a substrate S made of silicon, sapphire, gallium arsenide, or the like. As depicted in FIGS. 1 and 2, the wafer W has a plurality of devices D formed on a face side WS thereof that are demarcated by a plurality of projected dicing lines L that cross each other (perpendicularly in the first embodiment). The wafer W also has a metal film F formed entirely on a reverse side WR thereof, the metal film F being difficult to perform plasma etching on. According to the first embodiment, each of the projected dicing lines L has a width up to several tens μm, each of the devices D has a size in the range from 0.1 to 20 mm on each side, and the wafer W should preferably be divided into device chips DT (see FIG. 18) by plasma etching. According to the first embodiment, the wafer W has a thickness in the range from 30 to 300 μm. Each of the device chips DT includes part of the substrate S and a device D.

The wafer W includes a functional layer FL, which serves as part of the devices D, deposited on the face side WS of the wafer W. The functional layer FL includes a plurality of layers including electrically conductive films and low-permittivity insulation films (Low-k films) that are alternately stacked. A passivation film is deposited on the functional layer FL to protect the circuits of the devices D from the exterior environment and protect the circuits of the devices D physically and chemically. The passivation film includes a silicon nitride ($Si_3N_4$) film, a silicon oxide ($SiO_2$) film, or the like. Each of the low-permittivity insulation films includes an inorganic film of SiOF or BSG (SiOB) and an organic film such as a polymer film of polyimide, parylene, or the like. The passivation films and the low-permittivity insulation films are films that are difficult to perform plasma etching on.

Figure 3:
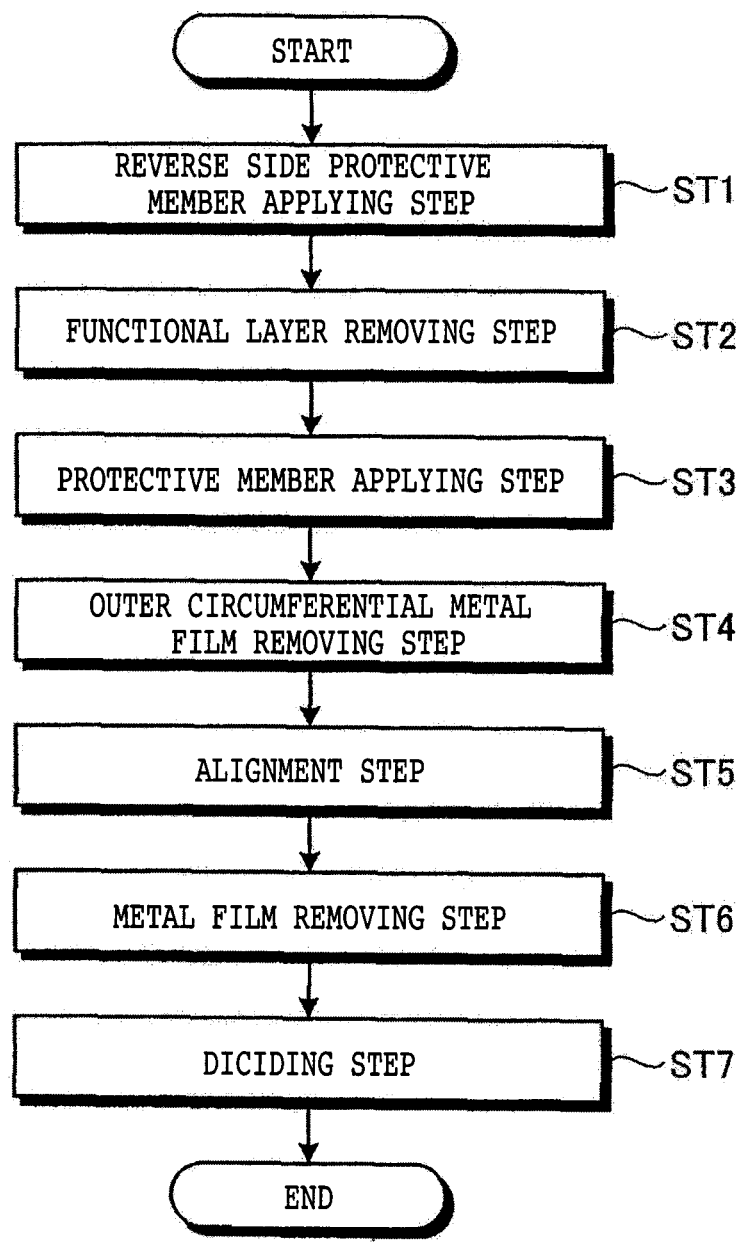
FIG. 3 is a flowchart of a sequence of the wafer processing method according to the first embodiment.

The wafer processing method according to the first embodiment is a method of cutting the wafer W along the projected dicing lines L to divide (or dice) the wafer W into device chips DT. As depicted in FIG. 3, the wafer processing method includes a reverse side protective member applying step ST1, a functional layer removing step ST2, a protective member applying step ST3, an outer circumferential metal film removing step ST4, an alignment step ST5, a metal film removing step ST6, and a dividing step ST7.

Figure 4:
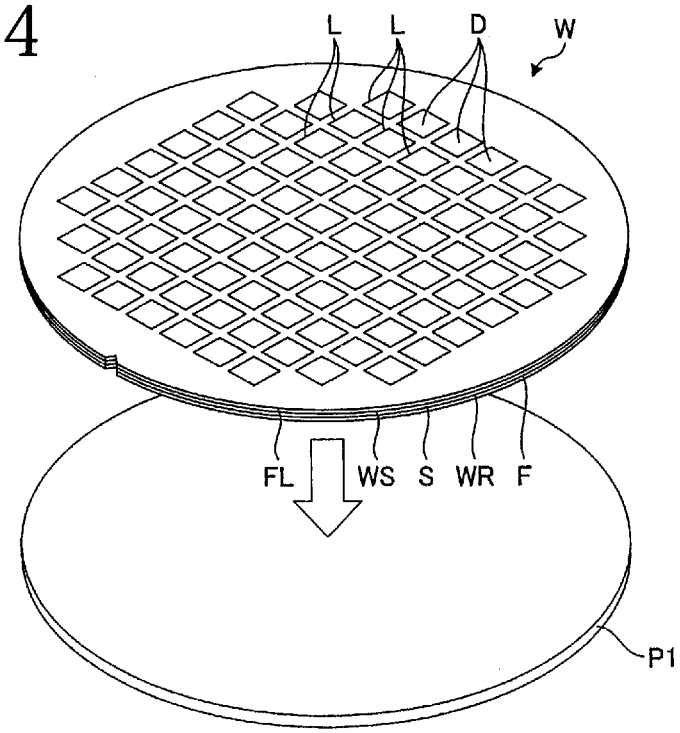
FIG. 4 is a perspective view depicting a reverse side protecting member applying step of the wafer processing method depicted in FIG. 3.
Figure 5:
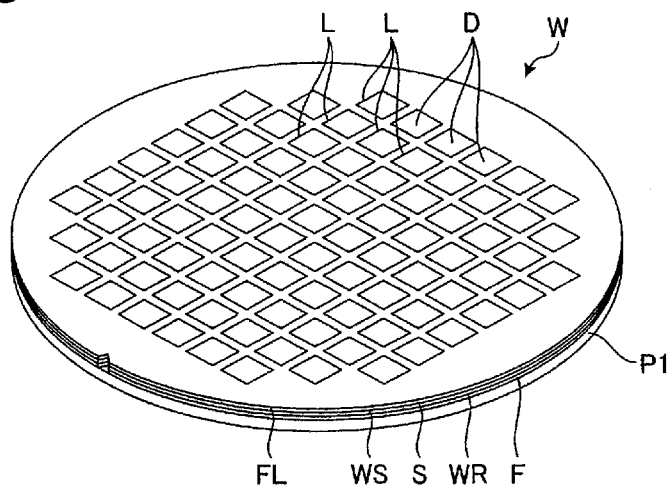
FIG. 5 is a perspective view of the wafer subsequent to the reverse side protecting member applying step of the wafer processing method depicted in FIG. 3.

The reverse side protective member applying step ST1 is a step of applying a protective member P1 (see FIG. 4) to the metal film F on the reverse side WR of the wafer W. According to the first embodiment, as depicted in FIGS. 4 and 5, the protective member P1 includes a protective tape made of flexible synthetic resin, and is of a shape identical to the wafer W.

Figure 6:
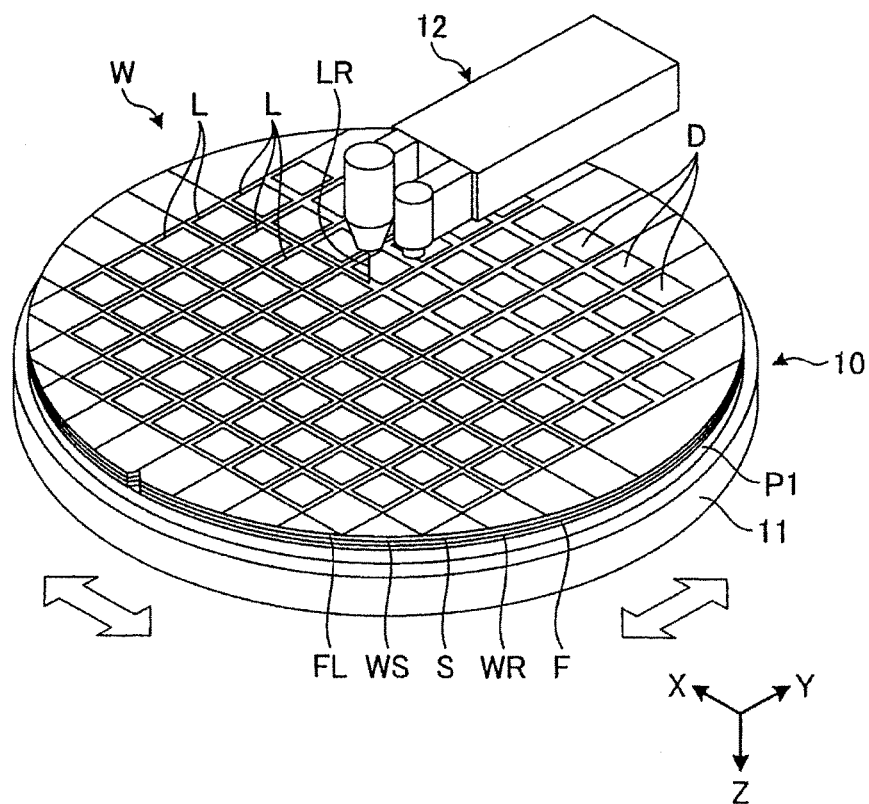
FIG. 6 is a perspective view depicting a functional layer removing step of the wafer processing method depicted in FIG. 3.
Figure 7:
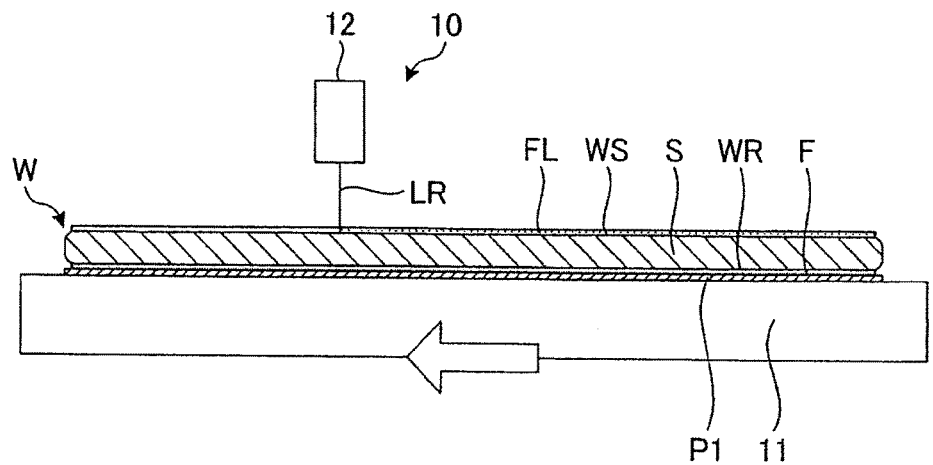
FIG. 7 is a cross-sectional view of the functional layer removing step of the wafer processing method depicted in FIG. 3.

The functional layer removing step ST2 is a step of removing the functional layer FL deposited on the face side WS of the wafer W therefrom along the projected dividing lines L, prior to the protective member applying step ST3. In the functional layer removing step ST2, a protective film, not depicted, of a water-soluble resin containing polyvinyl alcohol (PVA), polyvinyl pyrrolidone (PVP), or the like is formed on the face side WS of the wafer W, and the reverse side WR side of the wafer W is held under suction on a chuck table 11 (see FIG. 6) of a laser processing machine 10 through the protective member P1. Then, as depicted in FIGS. 6 and 7, while a laser beam applying unit 12 of the laser processing machine 10 is moving relatively to the wafer W along the projected dicing lines L, the laser beam applying unit 12 applies a laser beam LR to the wafer W along the projected dicing lines L to perform ablation on the functional layer FL on and along the projected dicing lines L. At this time, debris melted from the wafer W is prevented from being applied to the face side WS of the wafer W by the protective film.

In the functional layer removing step ST2, after the ablation of the functional layer FL, the protective film, not depicted, is removed, and the face side WS of the wafer W is cleaned to wash the protective film together with the debris from the wafer W, exposing the face side WS of the substrate S along the projected dicing lines L. According to the first embodiment, the functional layer removing step ST2 is carried out by applying the laser beam LR to the wafer W along the projected dicing lines L to perform ablation on the functional layer FL, and cleaning the face side WS of the wafer W to expose the face side WS of the substrate S along the projected dicing lines L. However, the present invention is not limited to such details of the functional layer removing step ST2. Rather, the wafer W may be cut along the projected dicing lines L by a cutting blade to remove the functional layer FL along the projected dicing lines L, thereby exposing the face side WS of the substrate S along the projected dicing lines L.

Figure 8:
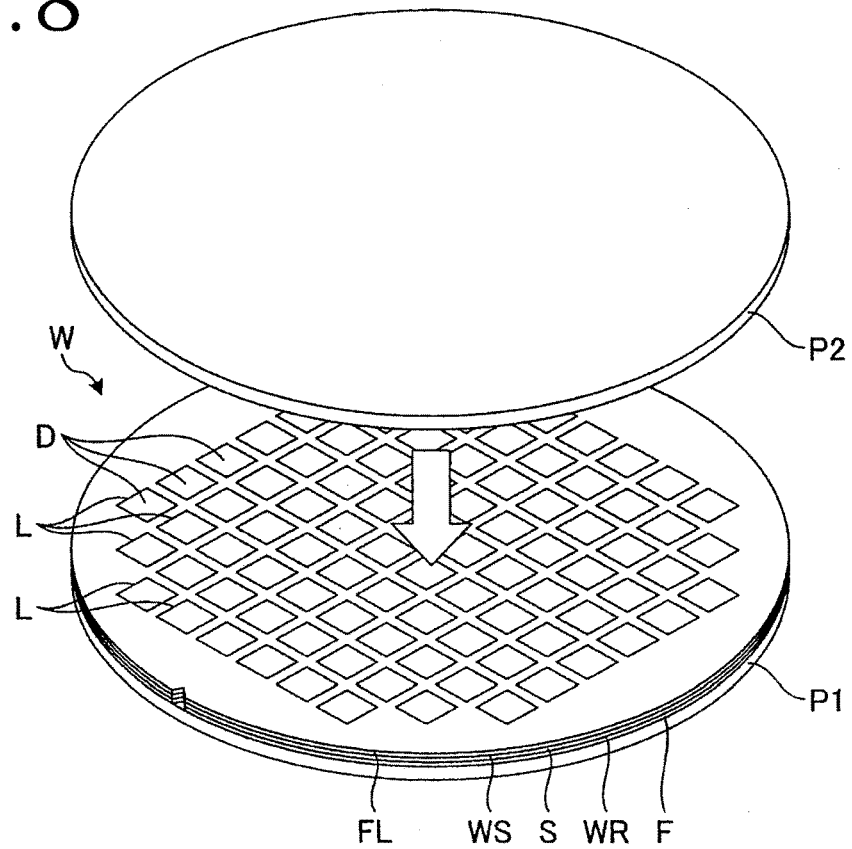
FIG. 8 is a perspective view depicting a protective member applying step of the wafer processing method depicted in FIG. 3.
Figure 9:
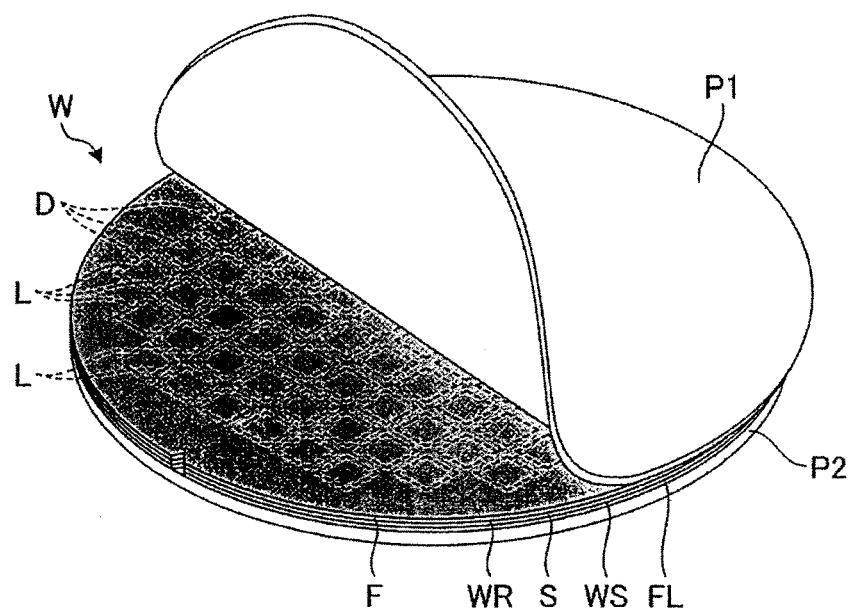
FIG. 9 is a perspective view depicting the manner in which a reverse side protecting member is peeled off in the protective member applying step of the wafer processing method depicted in FIG. 3.

The protective member applying step ST3 is a step of applying a protective member P2 (see FIG. 8) to the face side WS of the wafer W. In the protective member applying step ST3, the protective member P2 is applied to the face side WS of the wafer W, as depicted in FIG. 8, and then the protective member P1 is peeled off from the reverse side WR of the wafer W, as depicted in FIG. 9. According to the first embodiment, as with the protective member P1, the protective member P2 includes a protective tape made of flexible synthetic resin, and is of a shape identical to the wafer W. In FIG. 8, the lines along which the functional layer FL has been removed are omitted from illustration.

Figure 10:
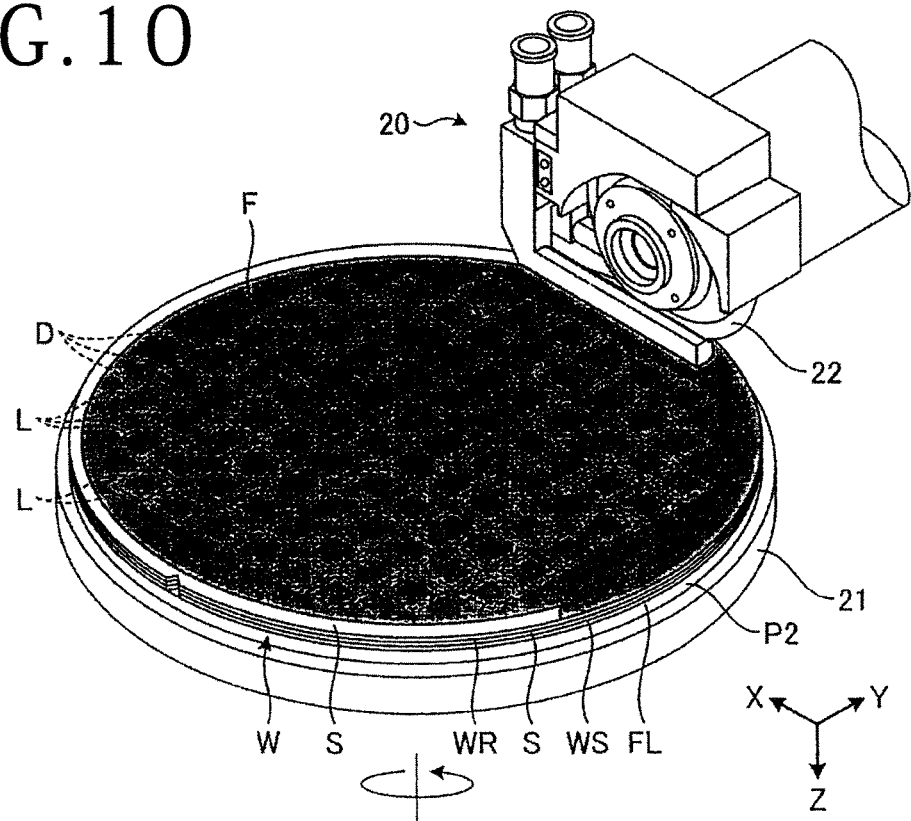
FIG. 10 is a perspective view depicting an outer circumferential metal film removing step of the wafer processing method depicted in FIG. 3.

The outer circumferential metal film removing step ST4 is a step of holding the protective member P2 side of the wafer W on a chuck table 21 (see FIG. 10) of a cutting apparatus 20, and removing the metal film F on the reverse side WR of the wafer W along an outer circumferential edge thereof, exposing the substrate S on and along the outer circumferential edge. In the outer circumferential metal film removing step ST4, the protective member P2 side of the wafer W is held under suction on the chuck table 21 of the cutting apparatus 20, and while the chuck table 21 is being rotated about its own axis parallel to a Z-axis direction by a rotary actuator, as depicted in FIG. 10, a cutting blade 22 is caused to cut into the metal film F on the outer circumferential edge of the wafer W, thereby exposing the substrate S on and along the outer circumferential edge.

Figure 11:
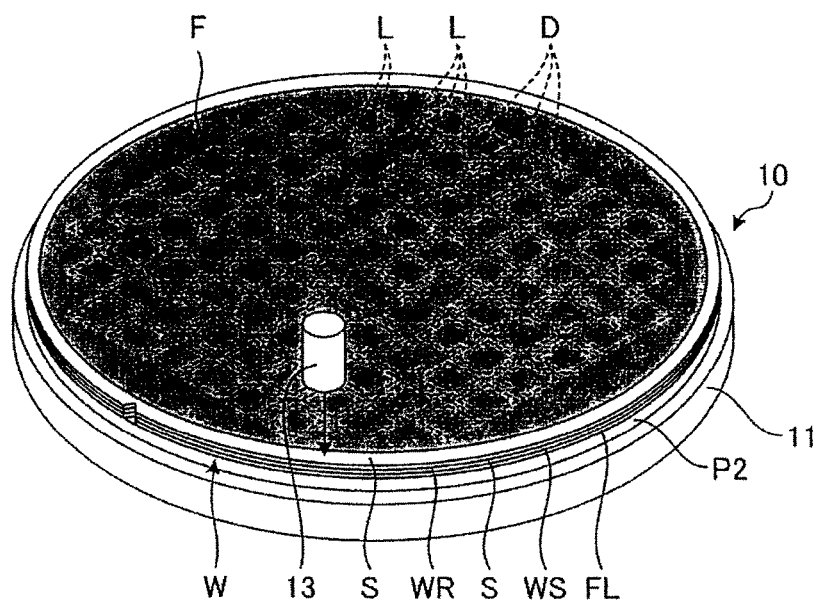
FIG. 11 is a perspective view depicting an alignment step of the wafer processing method depicted in FIG. 3.
Figure 12:
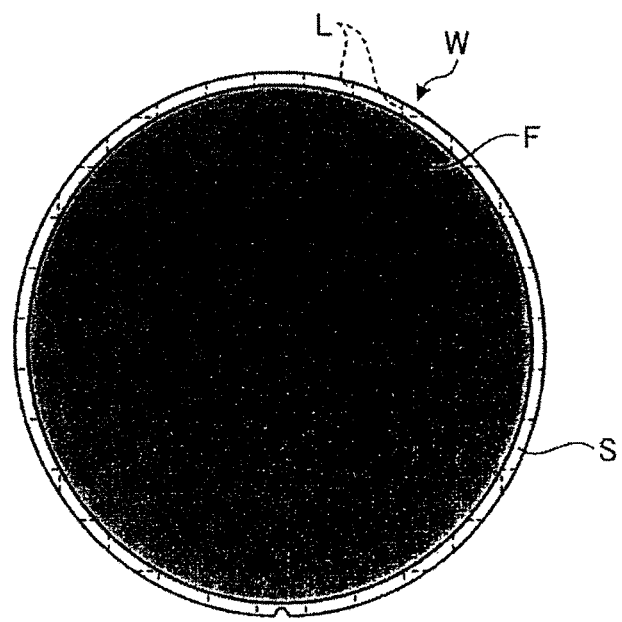
FIG. 12 is a plan view depicting the alignment step of the wafer processing method depicted in FIG. 3.
Figure 13:
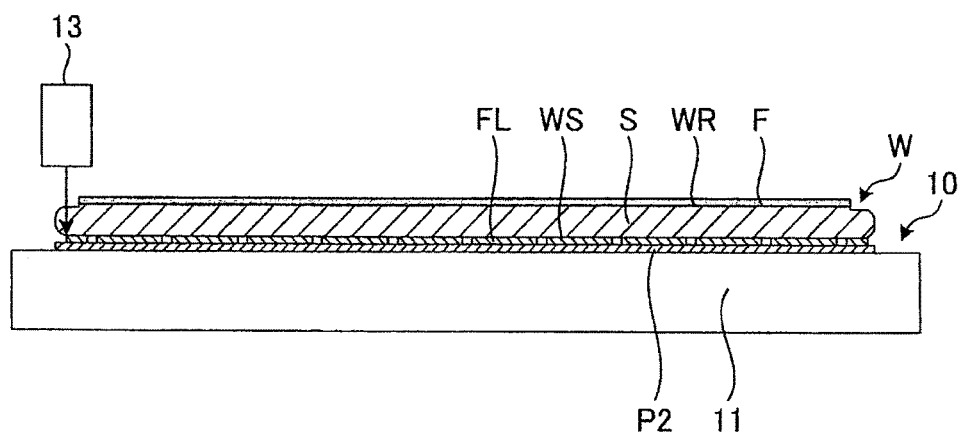
FIG. 13 is a cross-sectional view of the alignment step of the wafer processing method depicted in FIG. 3.

The alignment step ST5 is a step of detecting a projected dicing line L on the face side WS with an infrared camera 13 (see FIG. 11) of the laser processing machine 10 through the substrate S exposed on and along the outer circumferential edge, and performing alignment based on the detected projected dicing line L. In the alignment step ST5, as depicted in FIG. 11, the protective member P2 side of the wafer W is held under suction on the chuck table 11 of the laser processing machine 10, and the infrared camera 13 of the laser processing machine 10 captures an image of a projected dicing line L depicted in FIG. 12 in a preset area on the wafer W through the substrate S, as depicted in FIG. 13. Then, control means, which includes a computer, of the laser processing machine 10 detects the position of the projected dicing line L in the preset area on the wafer W, and performs positional alignment between the wafer W and the laser beam applying unit 12 based on the detected position.

Figure 14:
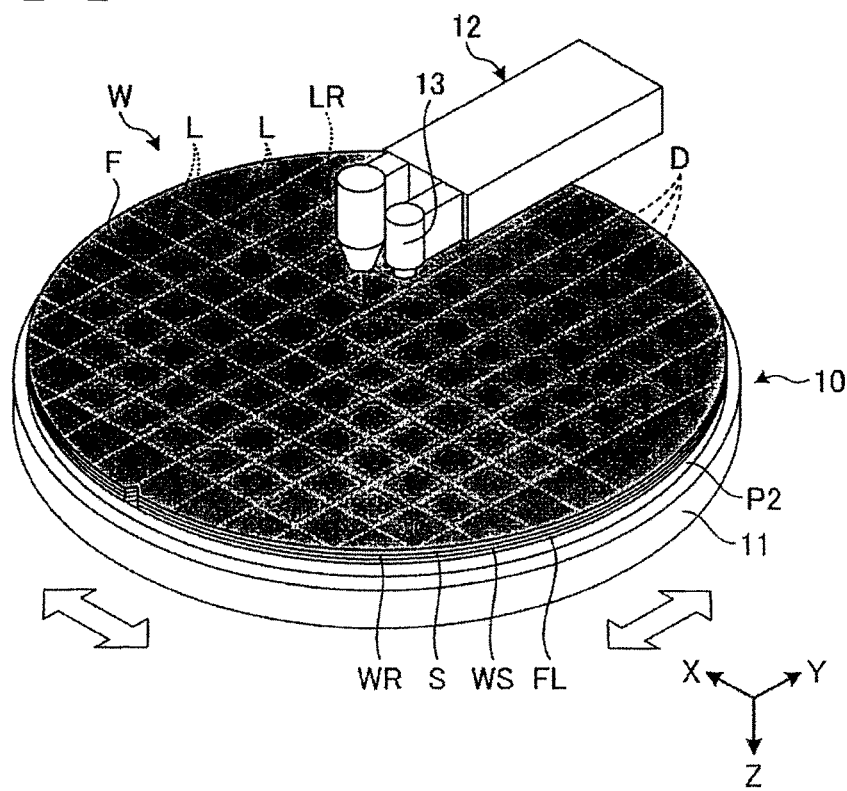
FIG. 14 is a perspective view depicting a metal film removing step of the wafer processing method depicted in FIG. 3.
Figure 15:
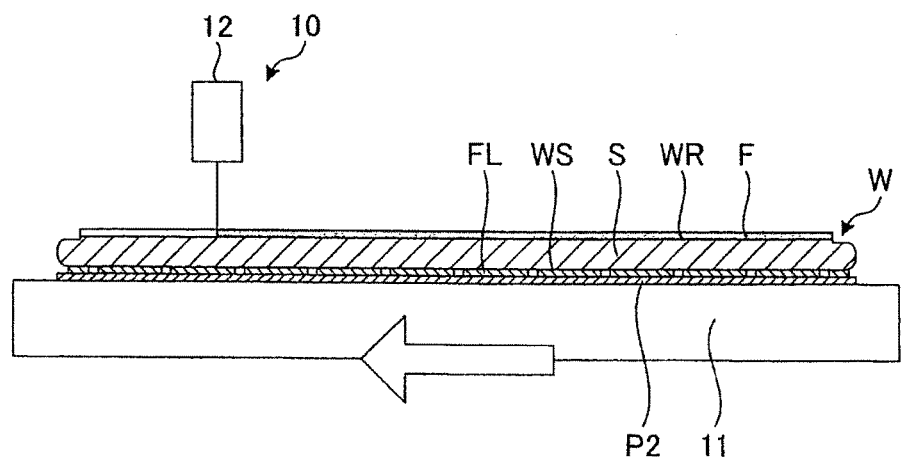
FIG. 15 is a cross-sectional view depicting the metal film removing step of the wafer processing method depicted in FIG. 3.
Figure 16:
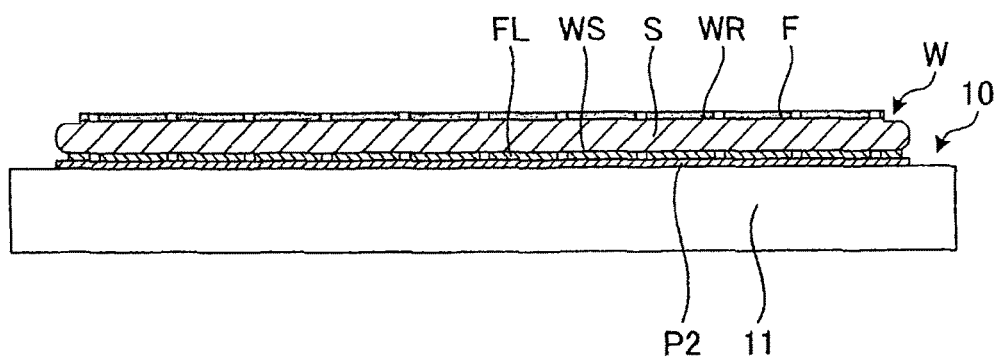
FIG. 16 is a cross-sectional view of the wafer subsequent to the metal film removing step of the wafer processing method depicted in FIG. 3.

The metal film removing step ST6 is a step of removing the metal film F on the reverse side WR along the projected dicing line L detected in the alignment step ST5. In the metal film removing step ST6, based on the position of the projected dicing line L in the preset area on the wafer W that has been detected in the alignment step ST5, the control means of the laser processing machine 10 processing-feeds the chuck table 11 in an X-axis direction, as depicted in FIGS. 14 and 15, and at the same time the laser beam applying unit 12 applies the laser beam LR to the projected dicing line L, performing ablation on the metal film F at a position overlapping the projected dicing line L thicknesswise. In the metal film removing step ST6, as depicted in FIG. 16, the metal film F is removed at positions that overlap the projected dicing lines L thicknesswise.

Figure 17:
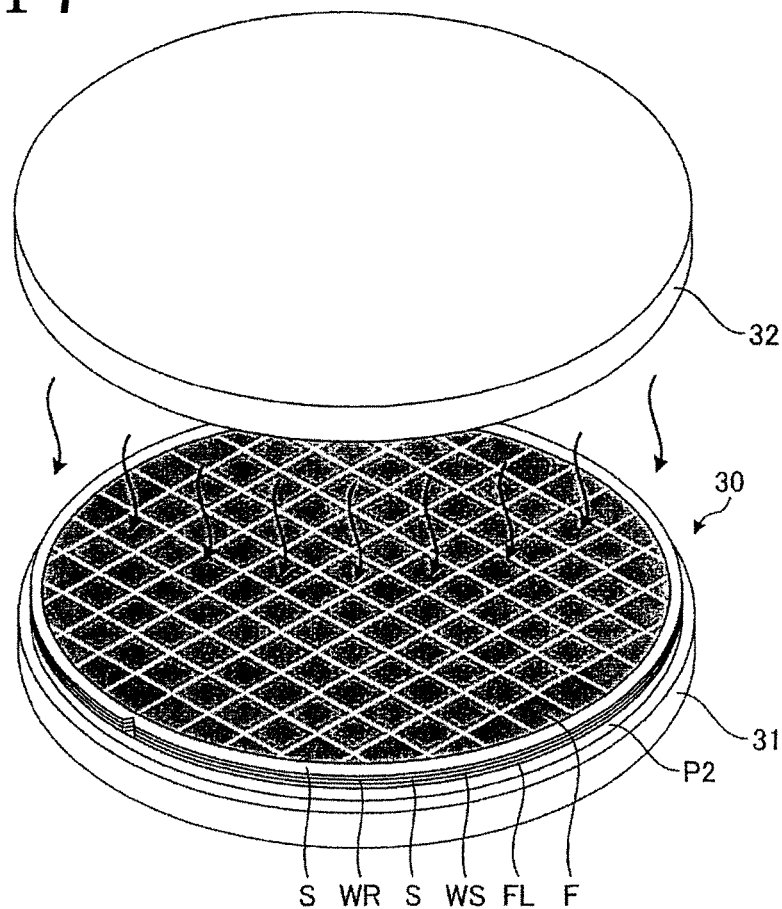
FIG. 17 is a perspective view depicting a dividing step of the wafer processing method depicted in FIG. 3.
Figure 18:
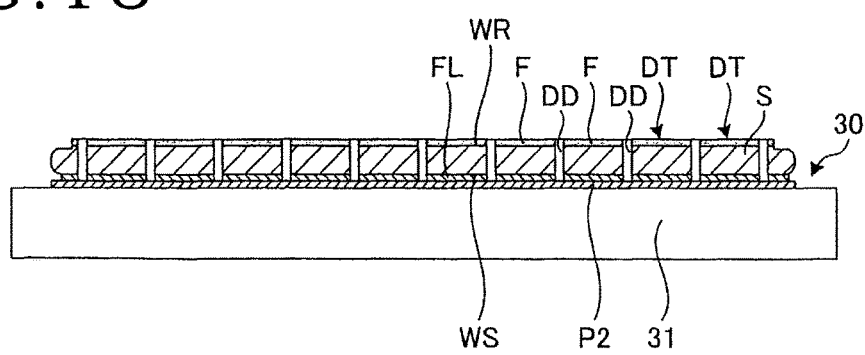
FIG. 18 is a cross-sectional view of the wafer subsequent to the dividing step of the wafer processing method depicted in FIG. 3.

The dividing step ST7 is a step of forming dividing grooves DD (see FIG. 18) in the substrate S, which extend thicknesswise from the reverse side WR to the face side WS, by plasma etching, and dividing the wafer W into individual device chips DT, subsequent to the metal film removing step ST6. In the dividing step ST7, the wafer W is placed in a housing, not depicted, of an etching apparatus 30 (see FIG. 17), and the face side WS of the wafer W is electrostatically attracted to and held on an attractive protective member 31 on a lower electrode connected to a high-frequency power supply, as depicted in FIG. 17.

In the dividing step ST7, specifically, a coolant from coolant supply means, not depicted, is circulated through a coolant passage, not depicted, defined in the lower electrode, not depicted, and the housing is evacuated. Gas supply means supplies an etching gas through ejection ports in an upper electrode 32 (see FIG. 17) connected to the high-frequency power supply toward the reverse side WR side of the wafer W in the housing. Then, with the etching gas being thus supplied, the high-frequency power supply applies high-frequency electric power to the upper electrode 32. In the dividing step ST7, therefore, a plasma is generated between the lower electrode and the upper electrode 32. Then, the high-frequency power supply applies high-frequency electric power to the lower electrode to draw ions in the plasma to the wafer W, thereby carrying out plasma etching on the reverse side WR side of the substrate S of the wafer W with the metal film F used as a shield film.

Since the substrate S is exposed along the projected dicing lines L on the reverse side WR side of the substrate S of the wafer W, the exposed substrate S is etched away, forming dividing grooves DD in the substrate S, which extend thicknesswise from the reverse side WR to the face side WS, along the projected dicing lines L. According to the first embodiment, the dividing step ST7 is finished after the plasma etching has been carried out for a period of time until the dividing grooves DD reach the face side WS of the wafer W. According to the present invention, however, the dividing grooves DD formed in the dividing step ST7 may terminate short of the face side WS, i.e., part of the substrate S may remain unremoved at the bottom of each of the dividing grooves DD. The wafer W that has been divided into the individual device chips DT is unloaded from the housing of the etching apparatus 30, after which the individual device chips DT are picked up from the protective member P2.

With the wafer processing method according to the first embodiment, the metal film F formed on the reverse side WR of the wafer W is removed along the outer circumferential edge of the wafer W in the outer circumferential metal film removing step ST4, and an image of a projected dicing line L on the face side WS is captured by the infrared camera 13 in the alignment step ST5, so that the metal film F can be removed along the projected dicing line L in the metal film removing step ST6. The wafer processing method according to the first embodiment is thus able to carry out the dividing step ST7 with plasma etching without the need for a separate mask by removing the metal film F along the projected dicing line L and using the unremoved portion of metal film F as a mask. As a result, the wafer processing method according to the first embodiment is advantageous in that it can divide the wafer W whose reverse side WR is coated with the metal film F into individual device chips DT without causing an increase in the cost.

A wafer processing method according to a second embodiment of the present invention will be described below with reference to FIGS. 19 through 27. A wafer W to be processed by the wafer processing method according to the second embodiment is identical to the wafer W to be processed by the wafer processing method according to the first embodiment. Therefore, the films, layers, and structural details of the wafer W in the second embodiment will be denoted by reference symbols identical to those which indicate the films, layers, and structural details of the wafer W in the first embodiment. The passivation film is deposited on the functional layer FL of the wafer W in the second embodiment.

Figure 19:
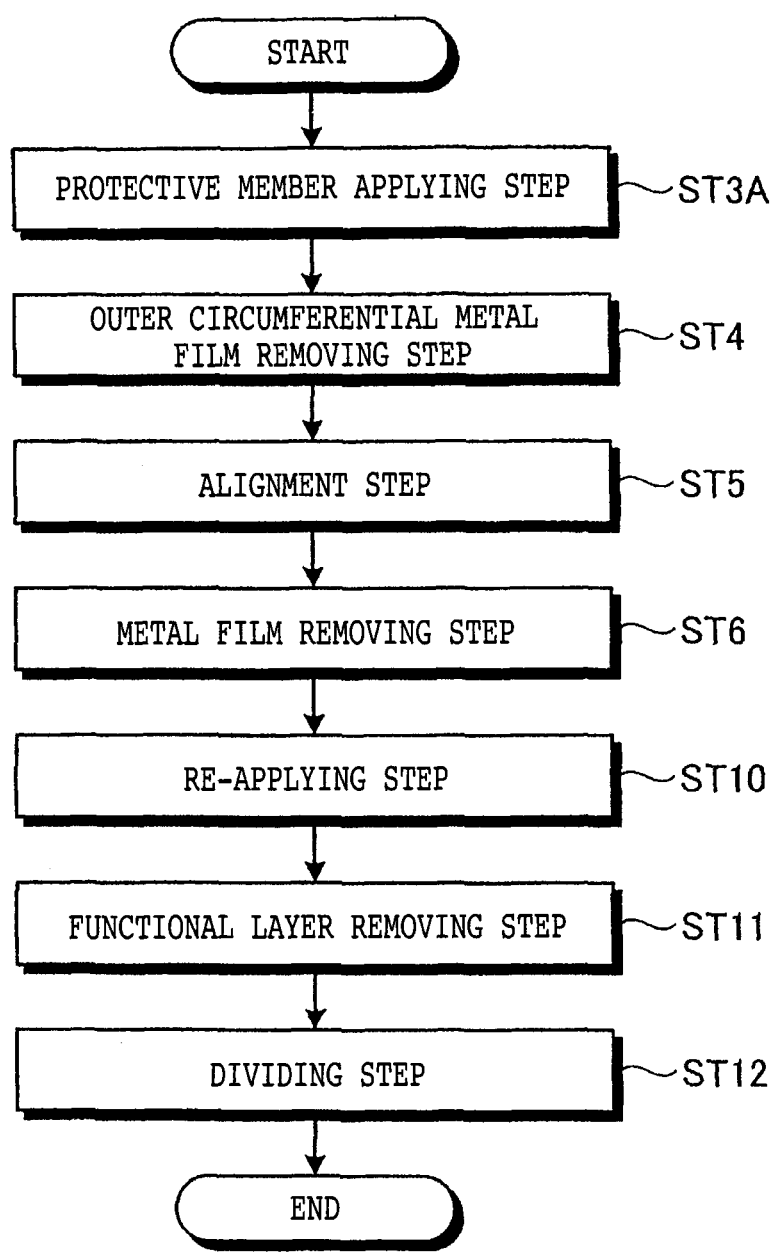
FIG. 19 is a flowchart of a sequence of a wafer processing method according to a second embodiment of the present invention.

As depicted in FIG. 19, the wafer processing method according to the second embodiment includes a protective member applying step ST3A, an outer circumferential metal film removing step ST4, an alignment step ST5A, a metal film removing step ST6, a re-applying step ST10, a functional layer removing step ST11, and a dividing step ST12.

Figure 20:
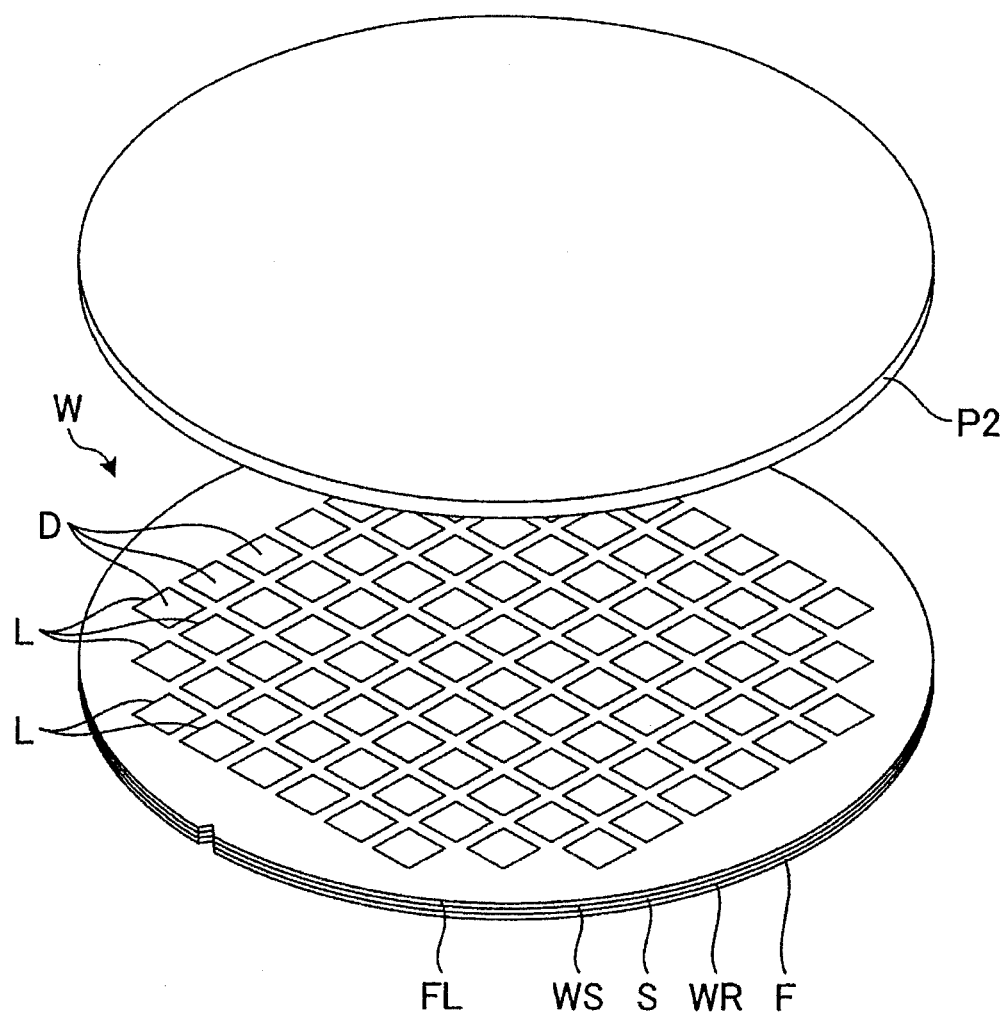
FIG. 20 is a perspective view depicting a protective member applying step of the wafer processing method depicted in FIG. 19.
Figure 21:
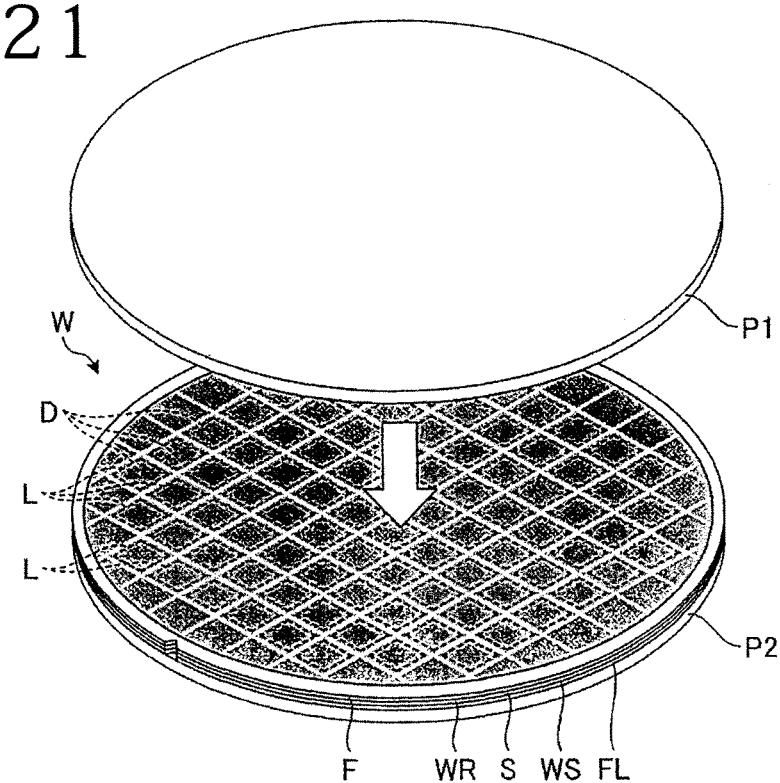
FIG. 21 is a perspective view depicting a re-applying step of the wafer processing method depicted in FIG. 19.
Figure 22:
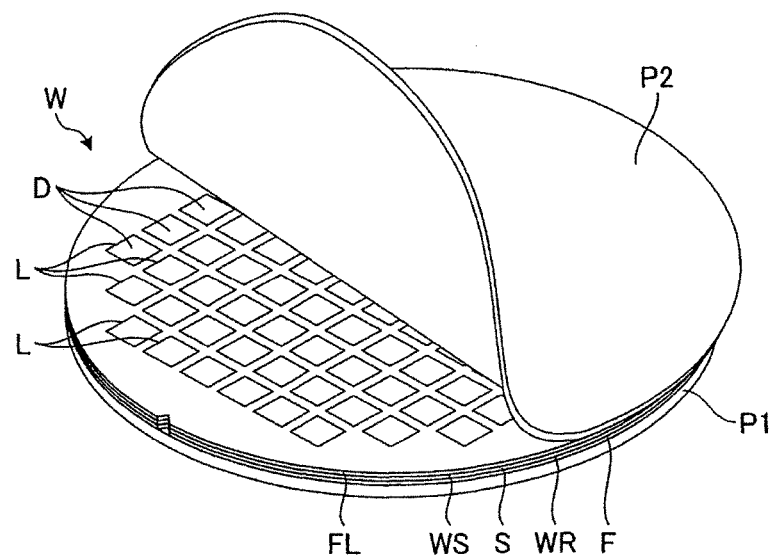
FIG. 22 is a perspective view depicting the manner in which a protective member is peeled off from the face side in the applying step of the wafer processing method depicted in FIG. 19.

In the protective member applying step ST3A, as depicted in FIG. 20, the protective member P2 is applied to the face side WS side of the wafer W where the functional layer FL on the projected dicing lines L has not been removed, i.e., the functional layer FL is present on the projected dicing lines L. The re-applying step ST10 is carried out after the outer circumferential metal film removing step ST4, the alignment step ST5, and the metal film removing step ST6 have been performed. In the re-applying step ST10, as depicted in FIG. 21, the protective member P1 is applied to the reverse side WR side of the wafer W from which the metal film F has been removed along the projected dicing lines L. Thereafter, as depicted in FIG. 22, the protective member P2 on the face side WS side of the wafer W is peeled off.

Figure 23:
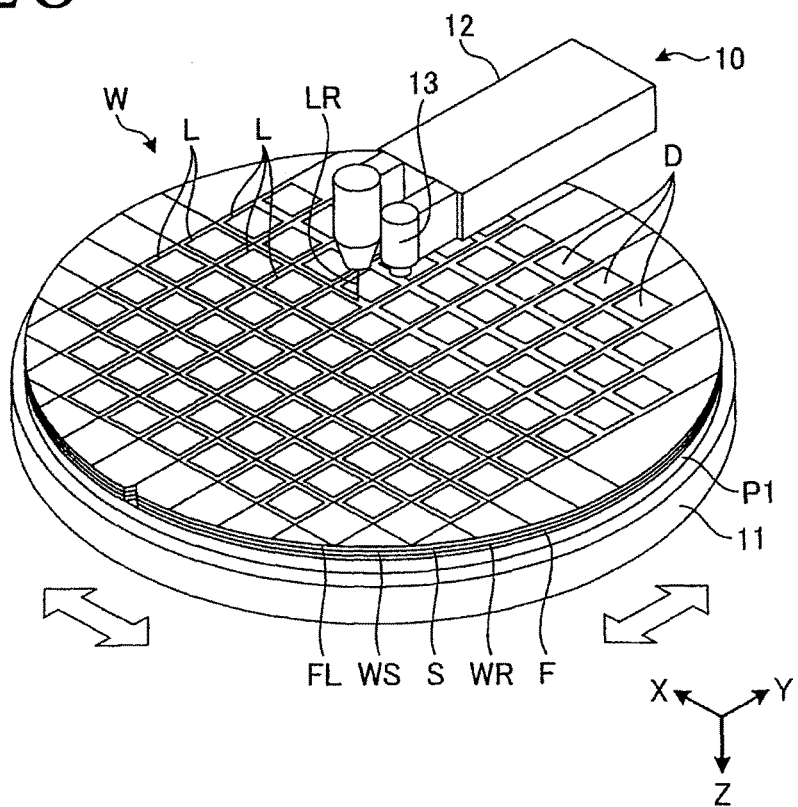
FIG. 23 is a perspective view of a functional layer removing step of the wafer processing method depicted in FIG. 19.
Figure 24:
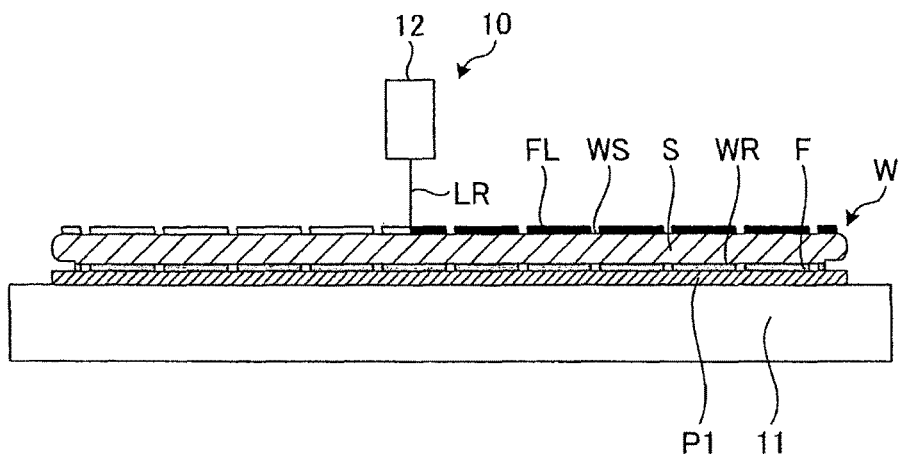
FIG. 24 is a cross-sectional view of the functional layer removing step of the wafer processing method depicted in FIG. 19.

In the functional layer removing step ST11, which follows the re-applying step ST10 and precedes the dividing step ST12, a protective film, not depicted, of a water-soluble resin containing PVA or PVP is formed on the face side WS of the wafer W, and the reverse side WR side of the wafer W is held under suction on the chuck table 11 (see FIG. 23) of the laser processing machine 10 through the protective member P1. Then, as depicted in FIGS. 23 and 24, while the laser beam applying unit 12 of the laser processing machine 10 is moving relatively to the wafer W along the projected dicing lines L, the laser beam applying unit 12 applies a laser beam LR to the wafer W along the projected dicing lines L to perform ablation on the functional layer FL on and along the projected dicing lines L.

In the functional layer removing step ST11, after the ablation of the functional layer FL, the protective film, not depicted, is removed, exposing the face side WS of the substrate S along the projected dicing lines L. According to the second embodiment, the functional layer removing step ST11 is carried out by applying the laser beam LR to the wafer W along the projected dicing lines L to perform ablation on the functional layer FL to expose the face side WS of the substrate S along the projected dicing lines L. However, the present invention is not limited to such details of the functional layer removing step ST11. Rather, the wafer W may be cut along the projected dicing lines L by a cutting blade to remove the functional layer FL along the projected dicing lines L, thereby exposing the face side WS of the substrate S along the projected dicing lines L.

Figure 25:
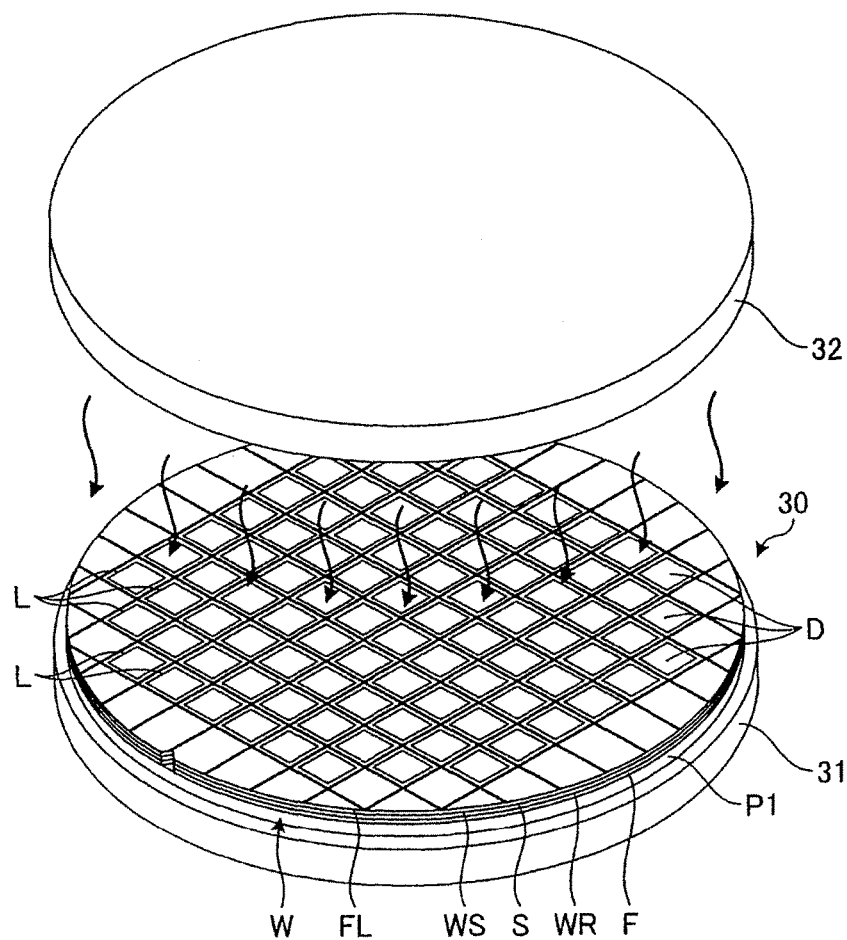
FIG. 25 is a perspective view depicting a dividing step of the wafer processing method depicted in FIG. 19.
Figure 26:
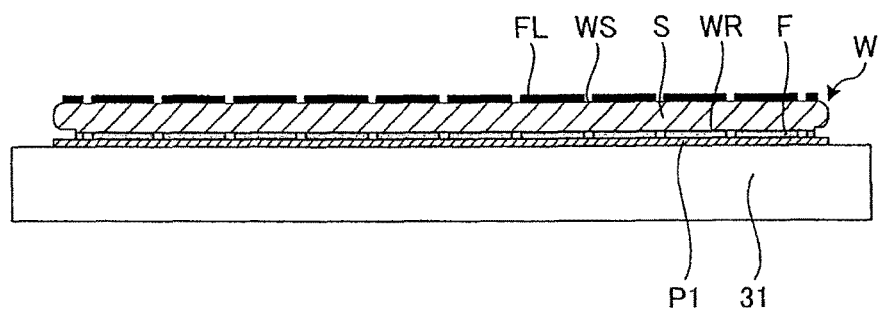
FIG. 26 is a cross-sectional view of the wafer prior to the dividing step of the wafer processing method depicted in FIG. 19.
Figure 27:
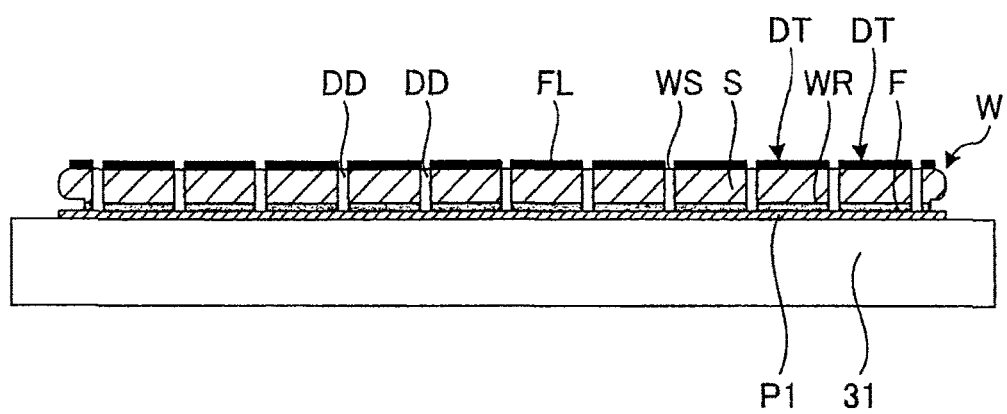
FIG. 27 is a cross-sectional view of the wafer subsequent to the dividing step of the wafer processing method depicted in FIG. 19.

The functional layer removing step ST11 is a step of removing the functional layer FL along the projected dividing lines L using the passivation film on the functional layer FL as a mask, prior to the dividing step ST12. The dividing step ST12 is a step of forming dividing grooves DD (see FIG. 27) in the substrate S, which extend thicknesswise from the face side WS to the reverse side WR, by plasma etching, and dividing the wafer W into individual device chips DT. In the dividing step ST12, as depicted in FIGS. 25 and 26, the wafer W is placed in the housing of the etching apparatus 30, and the reverse side WR of the wafer W is electrostatically attracted to and held on the attractive protective member 31 on the lower electrode connected to the high-frequency power supply. The coolant from coolant supply means is circulated through the coolant passage in the lower electrode, and the housing is evacuated. The gas supply means supplies the etching gas through the ejection ports in the upper electrode 32 connected to the high-frequency power supply toward the front side WS side of the wafer W in the housing. Then, in the dividing step ST12, with the etching gas being thus supplied, the high-frequency power supply applies high-frequency electric power to the upper electrode 32. In the dividing step ST12, therefore, a plasma is generated between the lower electrode and the upper electrode 32. Then, the high-frequency power supply applies high-frequency electric power to the lower electrode to draw ions in the plasma to the wafer W, thereby carrying out plasma etching on the substrate S of the wafer W with the unremoved portion of the passivation film used as a mask.

Since the substrate S is exposed along the projected dicing lines L on the wafer W, the exposed substrate S is etched away, forming dividing grooves DD in the substrate S, which extend thicknesswise from the face side WS to the reverse side WR, along the projected dicing lines L in the dividing step ST12. According to the second embodiment, the dividing step ST12 is finished after the plasma etching has been carried out for a period of time until the dividing grooves DD reach the reverse side WR of the wafer W. According to the present invention, however, the dividing grooves DD formed in the dividing step ST12 may terminate short of the reverse side WR. The wafer W that has been divided into the individual device chips DT is unloaded from the housing of the etching apparatus 30, after which the individual device chips DT are picked up from the protective member P1.

With the wafer processing method according to the second embodiment, as with the first embodiment, the metal film F formed on the reverse side WR of the wafer W is removed along the outer circumferential edge of the wafer W in the outer circumferential metal film removing step ST4, and an image of a projected dicing line L on the face side WS is captured by the infrared camera 13 in the alignment step ST5, so that the metal film F can be removed along the projected dicing line L in the metal film removing step ST6. The wafer processing method according to the second embodiment is thus able to carry out the dividing step ST12 with plasma etching without the need for a separate mask by removing the passivation film and the functional layer FL along the projected dicing line L and using the unremoved portion of the passivation film as a mask. As a result, the wafer processing method according to the second embodiment is advantageous in that it can divide the wafer W whose reverse side WR is coated with the metal film F into individual device chips DT without causing an increase in the cost.

With the wafer processing method according to the second embodiment, furthermore, when plasma dicing is carried out on the wafer W using the unremoved portion of the passivation film on the functional layer FL as a mask, since metal film F that overlaps the projected dicing lines L on the reverse side WR has been removed, the dicing of the wafer W is not obstructed by the metal film F. As a consequence, the wafer processing method according to the second embodiment is advantageous in that it can divide the wafer W whose reverse side WR is coated with the metal film F into individual device chips DT without causing an increase in the cost.

The present invention is not limited to the above preferred embodiments and modifications thereof. Various changes may be made therein without departing from the scope of the invention. For example, after the reverse side protective member applying step ST1 of applying the protective member P1 and the functional layer removing step ST2 have been carried out, the protective member applying step ST3, the outer circumferential metal film removing step ST4, the alignment step ST5, and the metal film removing step ST6 may be carried out, after which the re-applying step ST10 and then the dividing step ST12 according to the second embodiment may be performed. According to this alternative method, inasmuch as the thickness of the outer circumferential edge of the wafer W is reduced in the outer circumferential metal film removing step ST4, the focused position of the laser beam LR does not tend to vary in the metal film removing step ST6.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer having a plurality of devices formed on a face side thereof that are demarcated by a plurality of projected dicing lines that cross each other and a metal film formed on a reverse side thereof, comprising:
    a protective member applying step of applying a protective member to the face side of the wafer;
    an outer circumferential metal film removing step of holding a protective member side of the wafer on a chuck table and removing the metal film on the reverse side of the wafer along an outer circumferential edge of the wafer, thereby exposing a substrate of the wafer along the outer circumferential edge thereof;
    an alignment step of detecting a projected dicing line on the face side of the wafer with an infrared camera through the substrate exposed along the outer circumferential edge of the wafer, and performing alignment of the wafer based on the detected projected dicing line;
    a metal film removing step of removing the metal film on the reverse side of the wafer along the detected projected dicing line; and
    thereafter, a dividing step of forming dividing grooves in the substrate along the projected dicing lines by plasma etching, thereby dividing the wafer into individual device chips;
    wherein the dividing step includes performing plasma etching along the projected dicing lines using an unremoved portion of the metal film as a mask.

2. The method of processing a wafer according to claim 1, further comprising:
    a functional layer removing step of, before the protective member applying step, removing a functional layer deposited on the face side of the wafer, from the wafer along the projected dicing lines.

3. A method of processing a wafer including a substrate having a face side and a reverse side, a functional layer formed on the face side of the substrate, a passivation film formed on the functional layer and a metal film formed on the reverse side of substrate, wherein a plurality of devices are formed in the functional layer demarcated by a plurality of projected dicing lines that cross each other, the method comprising;
    a protective member applying step of applying a protective member on the passivation film formed on the functional layer;
    an outer circumferential metal film removing step of holding a protective member side of the wafer on a chuck table and removing the metal film on the reverse side of the substrate along an outer circumferential edge of the substrate, thereby exposing the substrate of the wafer along the outer circumferential edge thereof;
    an alignment step of detecting a projected dicing line on the functional layer with an infrared camera through the substrate exposed along the outer circumferential edge of the wafer, and performing alignment of the wafer based on the detected projected dicing line;
    a metal film removing step of removing the metal film on the reverse side of the wafer along the detected projected dicing line;
    a protective member removing step of removing the protective member from the passivation film of the wafer;
    a passivation film removing step of removing the passivation film formed on the functional layer deposited on the face side of the substrate, from the wafer along the projected dicing lines, and
    a dividing step of forming dividing grooves in the substrate along the projected dicing lines by plasma etching, thereby dividing the wafer into individual device chips;
    where in the dividing step includes performing plasma etching along the projected dicing lines using an unremoved portion of the passivation film as a mask.

* * * * *